United States Patent
Tsai et al.

(10) Patent No.: US 9,362,175 B2
(45) Date of Patent: Jun. 7, 2016

(54) EPITAXIAL GROWTH OF DOPED FILM FOR SOURCE AND DRAIN REGIONS

(71) Applicant: Taiwan Semiconductor Manufacturing Company, Ltd., Hsin-Chu (TW)

(72) Inventors: Chun Hsiung Tsai, Xinpu Township (TW); Jian-An Ke, New Taipei (TW); Tsan-Yao Chen, Jhubei (TW); Chin-Kun Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 71 days.

(21) Appl. No.: 14/504,697

(22) Filed: Oct. 2, 2014

(65) Prior Publication Data
US 2015/0017776 A1 Jan. 15, 2015

Related U.S. Application Data

(62) Division of application No. 13/829,770, filed on Mar. 14, 2013, now Pat. No. 8,877,592.

(51) Int. Cl.
*H01L 21/82* (2006.01)
*H01L 21/20* (2006.01)
(Continued)

(52) U.S. Cl.
CPC .. *H01L 21/823431* (2013.01); *H01L 21/02532* (2013.01); *H01L 21/02592* (2013.01); *H01L 21/02664* (2013.01); *H01L 21/30604* (2013.01); *H01L 21/324* (2013.01);
(Continued)

(58) Field of Classification Search
CPC ... H01L 21/00; H01L 29/66795; H01L 29/78; H01L 2029/7858; H01L 29/7848
USPC .......... 438/151, 41, 197, 167, 283, 478, 157, 438/287; 257/347, E21.7
See application file for complete search history.

(56) References Cited

U.S. PATENT DOCUMENTS 6,137,149 A 10/2000 Kodama
6,238,989 B1 5/2001 Wc Huang et al.
(Continued)

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.
(Continued)

*Primary Examiner* — Amar Movva
*Assistant Examiner* — Sheikh Maruf
(74) *Attorney, Agent, or Firm* — Slater Matsil, LLP

(57) ABSTRACT

Embodiments of mechanisms for epitaxially growing one or more doped silicon-containing materials to form source and drain regions of finFET devices are provided in this disclosure. The dopants in the one or more doped silicon-containing materials can be driven into the neighboring lightly-doped-drain (LDD) regions by thermal anneal to dope the regions. The epitaxially growing process uses a cyclical deposition/deposition/etch (CDDE) process. In each cycle of the CDDE process, a first and a second doped materials are formed and a following etch removes most of the second doped material. The first doped material has a higher dopant concentration than the second material and is protected from the etching process by the second doped material. The CDDE process enables forming a highly doped silicon-containing material.

20 Claims, 9 Drawing Sheets

(51) Int. Cl.
  *H01L 29/66* (2006.01)
  *H01L 21/8234* (2006.01)
  *H01L 21/02* (2006.01)
  *H01L 21/306* (2006.01)
  *H01L 21/324* (2006.01)
  *H01L 29/16* (2006.01)

(52) U.S. Cl.
  CPC ....... *H01L 21/823418* (2013.01); *H01L 29/16* (2013.01); *H01L 29/6656* (2013.01); *H01L 29/66795* (2013.01); *H01L 29/66803* (2013.01)

(56) References Cited

U.S. PATENT DOCUMENTS

| | | | |
|---|---|---|---|
| 7,030,012 B2 | 4/2006 | Divakaruni et al. | |
| 8,053,273 B2 | 11/2011 | Kammler et al. | |
| 2001/0023108 A1 | 9/2001 | Miyano et al. | |
| 2002/0105039 A1* | 8/2002 | Hanafi | H01L 29/78648 257/401 |
| 2005/0077570 A1 | 4/2005 | Nishinohara | |
| 2006/0084235 A1 | 4/2006 | Barr et al. | |
| 2006/0088968 A1 | 4/2006 | Shin et al. | |
| 2006/0115933 A1 | 6/2006 | Ye et al. | |
| 2006/0234504 A1 | 10/2006 | Bauer et al. | |
| 2006/0289902 A1 | 12/2006 | Ping et al. | |
| 2007/0259501 A1* | 11/2007 | Xiong | H01L 21/845 438/283 |
| 2007/0287272 A1 | 12/2007 | Bauer et al. | |
| 2009/0075029 A1 | 3/2009 | Thomas et al. | |
| 2009/0267118 A1* | 10/2009 | Chakravarti | H01L 21/02381 257/288 |
| 2010/0025779 A1* | 2/2010 | Kammler | H01L 21/26506 257/408 |
| 2011/0117732 A1 | 5/2011 | Bauer et al. | |
| 2011/0124169 A1 | 5/2011 | Ye et al. | |
| 2011/0212584 A9 | 9/2011 | Chakravarthi et al. | |
| 2011/0266617 A1* | 11/2011 | Nakazawa | H01L 29/0878 257/330 |
| 2011/0269287 A1* | 11/2011 | Tsai | H01L 21/2254 438/306 |
| 2012/0015493 A1* | 1/2012 | Lin | H01L 29/66795 438/303 |
| 2012/0056245 A1 | 3/2012 | Kang et al. | |
| 2012/0181625 A1 | 7/2012 | Kwok et al. | |
| 2012/0280250 A1* | 11/2012 | Basker | H01L 21/823821 257/77 |
| 2012/0295421 A1 | 11/2012 | Brabant et al. | |
| 2013/0056795 A1* | 3/2013 | Wu | H01L 29/66795 257/191 |
| 2013/0102138 A1* | 4/2013 | Yeh | H01L 21/823807 438/585 |
| 2013/0157431 A1* | 6/2013 | Tsai | H01L 29/66545 438/299 |
| 2013/0307076 A1* | 11/2013 | Cheng | H01L 21/845 257/350 |
| 2013/0328126 A1 | 12/2013 | Tsai et al. | |
| 2014/0099763 A1* | 4/2014 | Alptekin | H01L 21/02529 438/283 |

OTHER PUBLICATIONS

Fischer, P. R., et al. Lowe Temperature Silicone Deposition of Undoped and Doped Silicon Films, ECS Transactions, 2006, pp. 203-215, vol. 3 No. 2.

* cited by examiner

US 9,362,175 B2

EPITAXIAL GROWTH OF DOPED FILM FOR SOURCE AND DRAIN REGIONS

CROSS-REFERENCES TO RELATED APPLICATIONS

This application is a divisional of U.S. application Ser. No. 13/829,770, filed on Mar. 14, 2013, entitled "EPITAXIAL GROWTH OF DOPED FILM FOR SOURCE AND DRAIN REGIONS," which application is hereby incorporated herein by reference in its entirety.

The present application is related to U.S. application Ser. No. 13/493,626, entitled "EPITAXIAL FORMATION OF SOURCE AND DRAIN REGIONS" filed on Jun. 11, 2012. The present application is also related to U.S. application Ser. No. 13/719,826, entitled "Epitaxial Formation Mechanisms of Source and Drain Regions" and filed on Dec. 19, 2012, U.S. application Ser. No. 13/739,781, entitled "Thermal Budget Control for Epitaxial Formation of Source and Drain Regions" and filed on Jan. 11, 2013, and U.S. application Ser. No. 13/743,926, entitled "Defect Reduction for Formation of Epitaxial Layer in Source and Drain Regions" and filed on Jan. 17, 2013. The present application is further related to U.S. Application Ser. No. 61/780,784, entitled "Mechanisms for Doping Lightly Doped Drain (LDD) Regions of finFET Devices" and filed on Mar. 13, 2013. The above-mentioned applications are incorporated herein by reference in their entireties.

BACKGROUND

The semiconductor integrated circuit (IC) industry has experienced rapid growth. Over the course of this growth, functional density of the devices has generally increased by the device feature size or geometry has decreased. This scaling down process generally provides benefits by increasing production efficiency, lower costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type field effect transistors, also referred to as finFET devices, so called because the channel is formed on a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
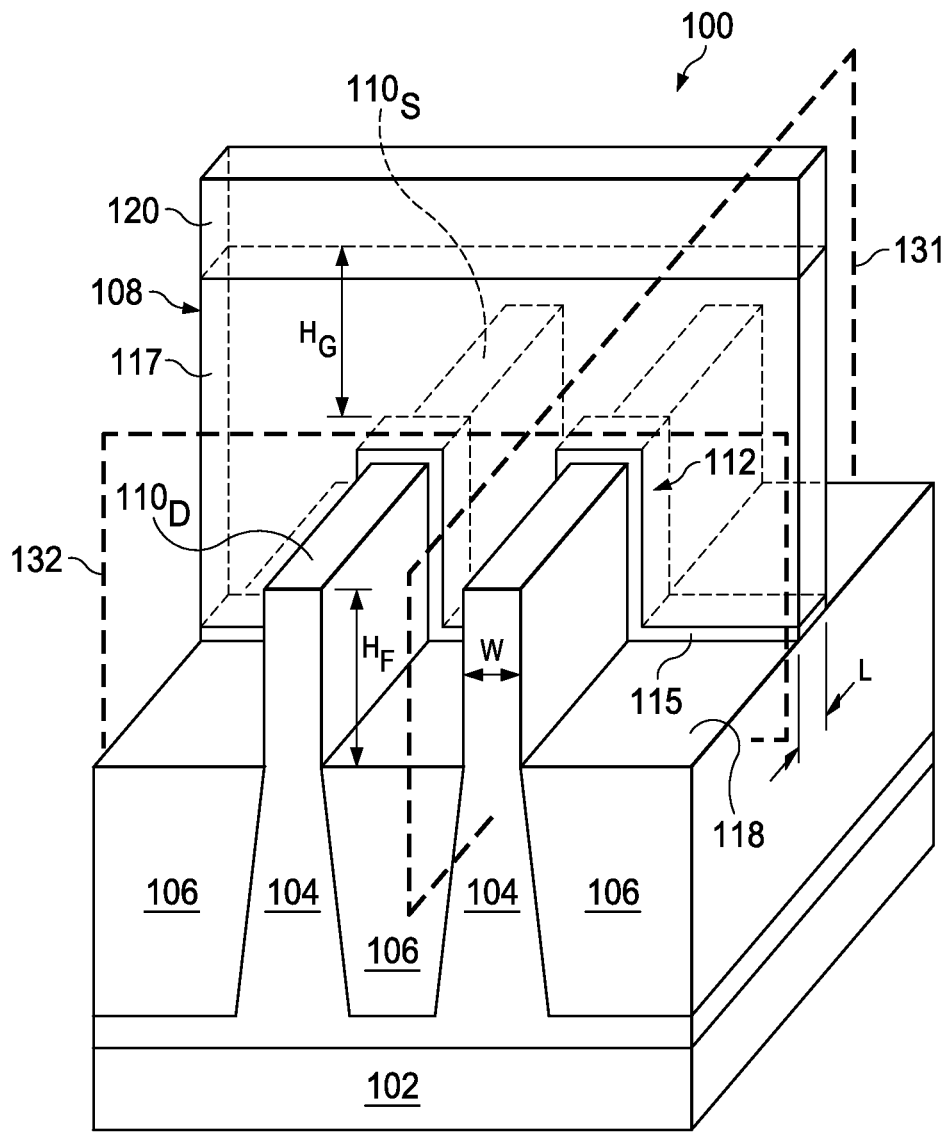
FIG. 1A is perspective view of an embodiment of a semiconductor device structure, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. It is understood that those skilled in the art will be able to devise various equivalents that, although not specifically described herein that embody the principles of the present disclosure.

It is also noted that the present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, tri-gate device, and/or other configuration. FinFET devices may be included in an IC such as a microprocessor, memory device, and/or other IC. One of ordinary skill may recognize other embodiments of semiconductor devices that may benefit from aspects of the present disclosure.

Illustrated in FIG. 1A is perspective view of a semiconductor device structure 100, in accordance with some embodiments. The semiconductor device structure 100 includes fin-FET device structures. The semiconductor device structure 100 includes a substrate 102, a plurality of fins 104, a plurality of isolation structures 106, and a gate structure 108 disposed on each of the fins 104. The gate structure 108 may include a gate dielectric layer 115, a gate electrode layer 117, and/or one or more additional layers. A mask layer 120 is over the gate electrode layer 117. The hard mask layer 120 is used to pattern, such as by etching, the gate structure 108. In some embodiments, the hard mask layer 120 is made of a dielectric material, such as silicon oxide. The perspective view of FIG. 1A is taken after the patterning (or forming) process of gate structure 108. FIG. 1A shows only one gate structure 108. There are additional gate structure(s) (not shown) similar and parallel to the gate structure 108 shown in FIG. 1A.

Each of the plurality of fins 104 include a source region $110_S$ and a drain region $110_D$, where source or drain features are formed in, on, and/or surrounding the fin 104. A channel region 112 of the fin 104 underlies the gate structure 108. The channel region 112 of fin 104 has a length (gate length) L, and a width (gate width) W, as shown in FIG. 1A. In some embodiments, the length (gate length) L is in a range from about 10 nm to about 30 nm. In some embodiments, the width (gate width) W is in a range from about 10 nm to about 20 nm. The height (gate height) $H_G$ of gate structure 108, measured from the top of fin 104 to the top of gate structure 108, is in a range from about 50 nm to about 80 nm, in some embodiments. The height (fin height) $H_F$ of fin 104, measured from the surface of isolation structure 106 to the top of fin 104, is in a range from about 25 nm to about 35 nm, in some embodiments.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 102 is a semiconductor on insulator (SOI).

The isolation structures 106 is made of a dielectric material and may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 102. The trenches may then be filled with isolating material, followed by a chemical mechanical polish (CMP). Other fabrication techniques for the isolation structures 106 and/or the fin structure 104 are possible. The isolation structures 106 may include a multi-layer structure, for example, having one or more liner layers.

The fin structures 104 may provide an active region where one or more devices are formed. In an embodiment, a channel region (112) of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into isolation structures 106, leaving protruding fins. The recesses may be etched using reactive ion etch (RIE) and/or other suitable processes. Numerous other embodiments of methods to form the fins 104 on the substrate 102 may be suitable.

The gate structure 108 may include a gate dielectric layer 115, a gate electrode layer 117, and/or one or more additional layers. In an embodiment, the gate structure 108 is a sacrificial gate structure such as formed in a replacement gate process used to form a metal gate structure. In an embodiment, the gate structure 108 includes polysilicon layer (as the gate electrode layer 117).

The gate dielectric layer 115 of the gate structure 108 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, the gate structure 108 may be a metal gate structure. The metal gate structure may include interfacial layer(s), gate dielectric layer(s), work function layer(s), fill metal layer(s) and/or other suitable materials for a metal gate structure. In other embodiments, the metal gate structure 108 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor device structure 100 described above include fins 104 and gate structure 108. The semiconductor device structure 100 needs additional processing to form various features, such as lightly-doped-drain (LDD) regions and doped source/drain regions, of the transistor utilizing structure 100. LDD regions are next to channel regions and are under spacers. The term LDD regions are used to describe lightly doped regions next to both source and drain regions.

Figure 1B:
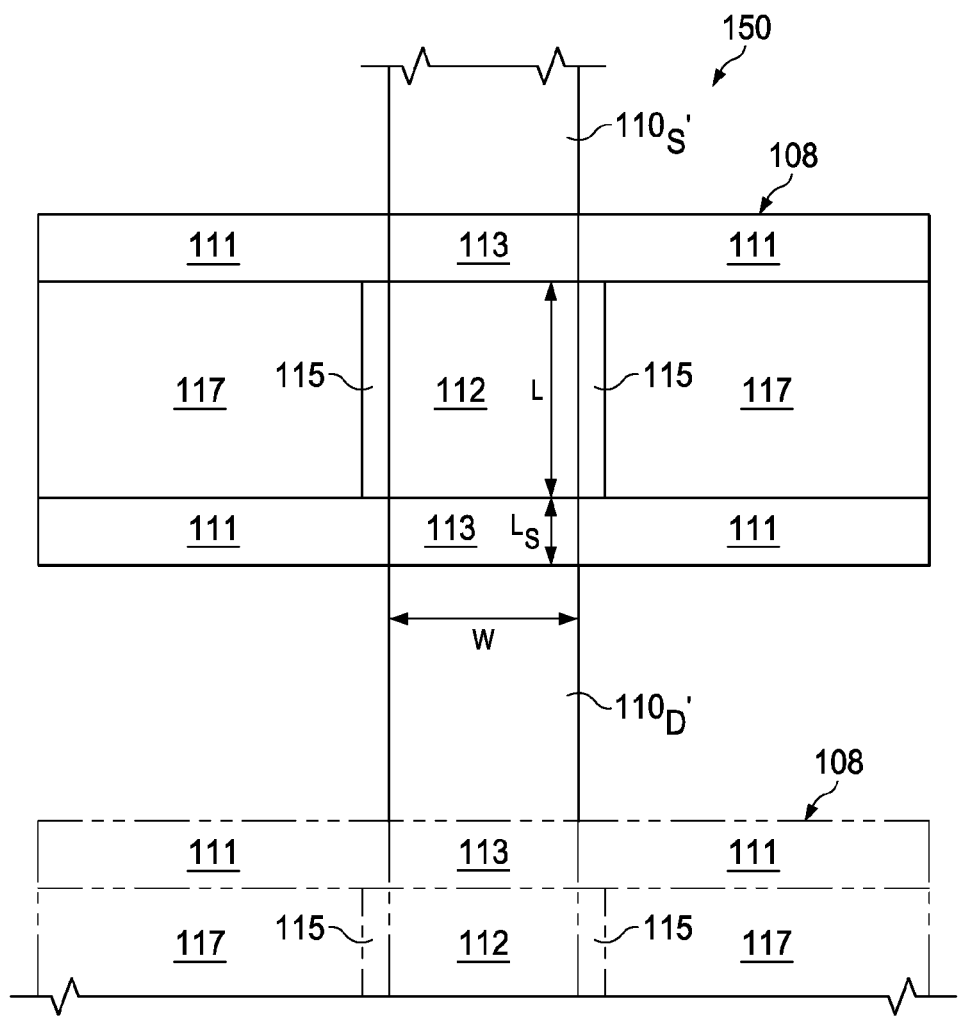
FIG. 1B shows a top view of a transistor region, in accordance with some embodiments.

FIG. 1B shows a top view of a transistor region 150 formed with one of the fins 104 of FIG. 1A and taken on a surface leveled with the top surface 118 of isolation structure 106, in accordance with some embodiments. Transistor region 150 includes a doped source region $110_S'$ and a doped drain region $110_D'$, which have the same cross-sections as doped source regions $110_S$ and doped drain region $110_D$, respectively, of FIG. 1A at surface 118.

Transistor region 150 also includes a channel region 112, which is part of fin 104 and is surrounded by gate structure 108 on 3 sides, as shown in FIG. 1A. The channel region 112 has a length (gate length) L and a width (gate width) W. Transistor region 150 also includes gate dielectric layer 115 and gate electrode layer 117. FIG. 1B shows LDD regions between source region $110_S$ and channel region 112, and between drain region $110_D$ and channel region 112. The LDD regions 113 has a width W and a length $L_S$, which is defined by the width of spacers 111. FIG. 1B shows another gate structure 108 by dotted lines. This other gate structure 108 has been described above as being similar and parallel to the gate structure 108 and is not shown in FIG. 1A. In some embodiments, Ls is in a range from about 5 nm to about 10 nm.

The transistor region 150 have features that are not shown in FIG. 1A, such as LDD region 113 and spacers 111, and features that are different from those in FIG. 1A, such as doped source/drain regions $110_S'$, $110_D'$ (to be described below). Processing sequence and structures involved in forming the LDD regions 113, spacers 111, and doped source/drain regions $110_S'$, $110_D'$ are described below. Doping LDD regions 113 is a challenge for finFET devices, because LDD regions 113 are shadowed by the tall gate structures if ion implantation is employed. The fine spacing, which is in the range of nanometers (nm), between neighboring gate structures 108 also limit the usage of plasma doping due to the relatively larger plasma sheath thickness, which is in the range of millimeters (mm). Consequently, there is a need for a mechanism of doping the LDD regions 113 for advanced finFET devices.

Figure 2:
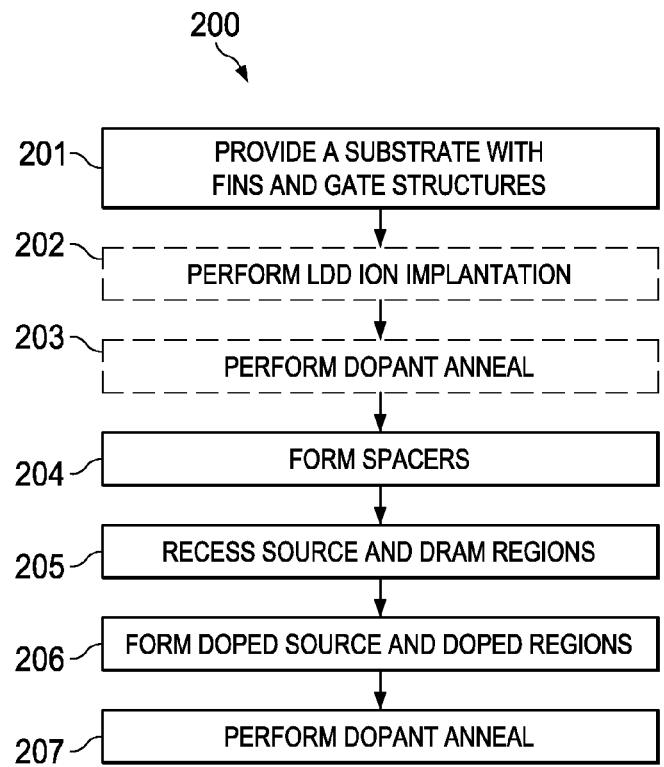
FIG. 2 shows a sequential process flow of doping lightly-doped-drain (LDD) regions and source/drain regions in a transistor region, in accordance with some embodiments.

FIG. 2 shows a sequential process flow 200 of doping LDD regions and source/drain regions in transistor region 150, in accordance with some embodiments. FIGS. 3A-3J show cross-sectional views of the transistor region of the sequential process flow of FIG. 2, in accordance with some embodiments. The processing sequence and structures described below are mainly for N-type finFET devices. However, at least portions of the embodiments described below may be applied for P-type finFET devices.

Process flow 200 begins at an operation 201 during which a substrate with fins and gate structures, such as the one shown in FIG. 1A, is provided. The substrate undergoes various processing sequences to form the structures, such as fins 104, isolation structures 106, and gate structure(s) 108. Ion implantation has been used as a doping process for many technology nodes. Ion implantation is directional and could be affected by shadowing effect as a result of high aspect ratio(s) of neighboring structures of LDD regions 113. The gate structures 108 (along with the hard mask layer 120) blocks the line of sights of doping ions arriving from above the surfaces of substrate 102. As a result, limited amount of dopants can reach LDD regions 113. However, ion implantation can be used in some embodiments to implant some amount of dopants in LDD regions 113.

The dopant ions of the ion implantation process 119 could move toward the surface of substrate 102 at an angle. For N-type finFET devices, the dopants could be phosphorus (P), or arsenic (As). The dopants penetrate the spacer layer 116 to reach the exposed regions of fin 104. The dopant level in LDD regions 113 is in a range from about 1E20 to about 5E20 atoms/cm$^3$. Due to shadowing effect of neighboring gate structures, it is difficult to achieve high dopant level in LDD regions 113. As a result, other mean(s) of doping is needed. In some embodiments, ion implantation is not used.

An optional operation 202 follows operation 201. During operation 202, ion implantation is performed to dope at least a portion of the LDD regions 113. Another doping mechanism would be described below to provide sufficient dopant level for the LDD regions 113. In some embodiments, ion implantation is not used. To dope the LDD regions 113 by implant, a spacer layer is deposited over surface of substrate 102 to cover gate structures 108, which have a hard mask layer over the structures), and exposed surfaces of fins 104, such as drain regions $110_D$. The spacer layer is made of a dielectric material, such as silicon oxide, silicon oxynitride (SiON), or silicon nitride (SiN), in some embodiments. In some embodiments, the deposition process is a plasma-enhanced chemical vapor deposition (PECVD) process. Other applicable deposition process may also be used. In some embodiments, the thickness of spacer layer is in a range from about 2 nm to about 4 nm. The spacer layer provides an offset distance, which is the thickness of spacer layer, from the channel region 112 and prevents the dopants from being implanted in the channel region 112.

After the dopant ions are implanted, a thermal anneal is performed to drive in and to activate the dopants at operation 203, in accordance with some embodiments. The thermal anneal may utilize rapid thermal processing (RTP) anneal, spike anneal, millisecond anneal, or laser anneal. Spike anneal operates at peak anneal temperature in the order of second. Millisecond anneal operates at peak anneal temperature in the order of milliseconds and laser anneal operates at peak anneal temperature in the order of micro seconds.

Following either operation 201, 202, or 203 (depending on the process flow used), spacers 111 are formed at operation 204. As mentioned above, a spacer layer is deposited to provide an offset. Spacer layer may also be called an offset spacer layer. In some embodiments, the spacers include another spacer layer, which may also be called a main spacer layer. Main spacer layer has a thickness in a range from about 5 nm to about 10 nm. Main pacer layer is made of a dielectric material, such as silicon oxynitride (SiON), silicon nitride (SiN), or carbon-doped silicon nitride (SiCN). SiCN has relative low etch rate against etchants, such as $H_3PO_4$ and HF, in comparison to SiN or SiON. In some embodiments, the deposition process is a plasma-enhanced chemical vapor deposition (PECVD) process. Other applicable deposition process may also be used. In some embodiments, each of spacers 111 has a width in a range from about 5 nm to about 10 nm.

After spacers 111 are formed, the source and drain regions of N-type devices) are recessed by etching at operation 205. One or more etching processes may be used to recess the source and drain regions. The etching process(es) may include a dry process(es), such as a plasma etching process, a wet etching process(es), or a combination of both. In some embodiments, a wet etch is used to form the recesses. For example, an etchant such as carbon tetrafluoride ($CF_4$), HF, tetramethylammonium hydroxide (TMAH), or combinations of thereof, or the like may be used to perform the wet etch and form the recesses. In some embodiments, a layer of SiN of about 50 angstroms thickness may be formed for recess proximity control.

Figure 3A:
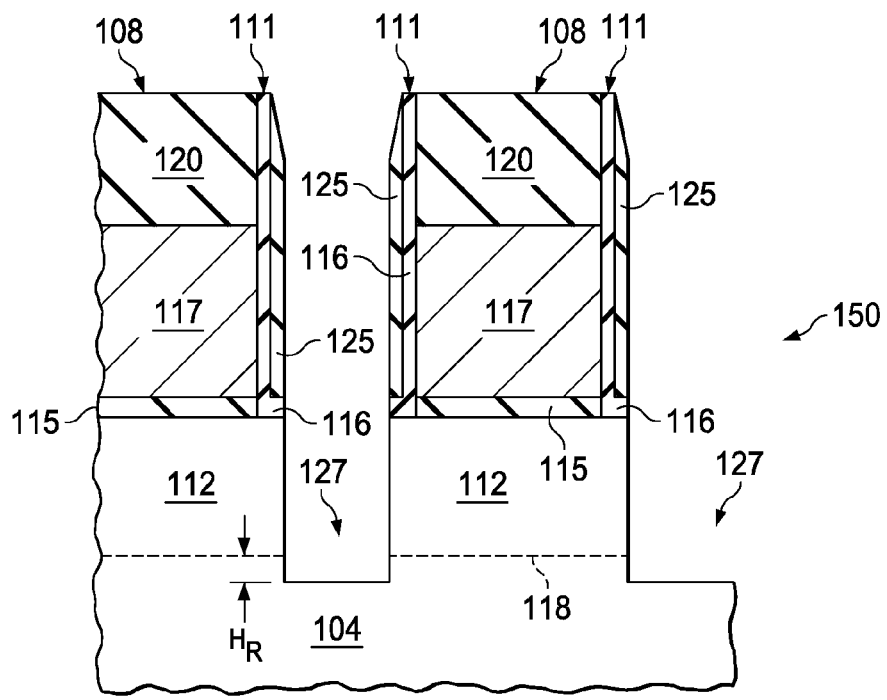
FIGS. 3A and 3B show cross-sectional views of a transistor region, in accordance with some embodiments.
Figure 3B:
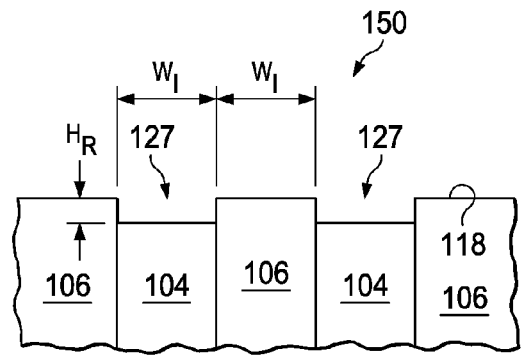

FIGS. 3A and 3B show cross-sectional views of transistor region 150 after recesses 127 are formed, in accordance with some embodiments. Prior to recessing the source and drain regions of N-type devices, a photolithography process could be used to cover other regions, such as P-type device regions, on substrate 102, with photoresist to prevent etching. As a result, a resist removal process is needed after the etching process and before the next operation. Additional cleaning process could be used to ensure no residual resist remains on the substrate.

FIG. 3A shows two neighboring gate structures 108. As mentioned above, there are additional gate structure(s) similar and parallel to the gate structure 108 shown in FIG. 1A. FIG. 3A shows two neighboring gate structures 108 are formed over one of the fin 104 and are separated by recesses 127, which are formed by etching source/drain regions $110_D$ and $110_S$ of FIG. 1A. For simplicity of discussion, we designate recesses 127 as recessed drain region ($110_D$). Each gate structure 108 includes a gate electrode layer 117 and a gate dielectric layer 115. A hard mask layer 120 is formed over the gate electrode layer 117, in accordance with some embodiments. The hard mask layer 120 is used in assisting patterning of gate structures 108. In some embodiments, the thickness $H_1$ of hard mask layer 120 is in a range from about 70 nm to about 100 nm. The thickness $H_2$ of gate electrode layer 117 is in a range from about 80 nm to about 100 nm. The thickness $H_3$ of gate dielectric layer 115 is in a range from about 2 nm to about 3 nm. The channel length L is shown in FIG. 3A as equal to the width of gate electrode layer 117 of a gate structure 108. Channel regions 112, which are directly under the gate structures 108 are also noted in FIG. 3A. A dotted line 118 indicates the level of surfaces of isolation regions 106.

FIG. 3A also show spacers 111 formed next to the gate structures 108. Spacers 111 include an offset spacer layer 116 and a main spacer layer 125, in accordance with some embodiments. Between neighboring gate structures 108, there are recesses 127. The depth $H_R$ of recesses 127 below surface 118 of isolation structures 106 is in a range from about 10 nm to about 20 nm. The recesses 127 may be formed to have either an angular or rounded shape on the bottoms.

FIG. 3B shows a cross-sectional view of transistor region 150 according to the cut 132 illustrated in FIG. 1A, in accordance with some embodiments. FIG. 3B shows recesses 127 in two neighboring recessed fins 104 separated (or isolated) from each other by an isolation structure 106. Each of the two neighboring recessed fins 104 has isolation structures 106 on both sides. Each fin 104 has a portion protruding above surfaces 107 of neighboring isolation structures 106. The distance $W_I$ between the two neighboring recesses 127 is in a range from about 10 nm to about 20 nm, in some embodiments.

Prior to recessing the source and drain regions of N-type devices, a photolithography process could be used to cover other regions, such as P-type device regions, on substrate 102, with photoresist to prevent etching. As a result, a resist removal process is needed after the etching process and before the next operation. Additional cleaning process could be used to ensure no residual resist remains on the substrate.

After the recesses 127 are formed, an epitaxial material is deposited in recesses 127 to form doped source and drain regions, $110_D'$ and $110_S'$ respectively, at operation 206 of FIG. 2, in accordance with some embodiments. Doped source and drain regions $110_D'$ and $110_S'$ are located right next to the LDD regions 113, which are between channel regions 112 and source/drain regions $110_D'$, $110_S'$. The dopants in the doped source and drain regions, $110_D'$, $110_S'$, could diffuse into and dope the LDD regions 113 by anneal. In order to dope the LDD regions 113, the dopant concentration of the doped source and drain regions $110_D'$ and $110_S'$ needs to be much higher than the required dopant concentration of the LDD regions 113. For example, if the dopant level (or concentration) of N-type dopant in the LDD regions 133 is at a value equal to or greater than about 1E20 atoms/cm³, the dopant concentration of the doped source and drain regions should have a value equal to or greater than about 3E20 atoms/cm³.

In some embodiments, the epitaxial material filling recesses 127 to form doped source and drain regions, $110_D'$ and $110_S'$, is a silicon-containing material 215. In some embodiments, the epitaxially-grown silicon-containing material 215 is formed by an epitaxial deposition/partial etch process, which repeats the epitaxial deposition/partial etch process at least once. Such repeated deposition/partial etch process is also called a cyclic deposition-deposition-etch (CDDE) process.

The deposition of the silicon-containing material 215 includes in-situ doping the silicon-containing material 215, in accordance with some embodiments. For example, forming an n-type transistor can use an n-type doping precursor, e.g., phosphine ($PH_3$) and/or other n-type doping precursor. By using the in-situ doping process, the dopant concentration (or level) of the silicon-containing material 215 can be desirably controlled and achieved. In some embodiments, the silicon-containing material 215 can be an n-type doped silicon layer that is doped with phosphorus (Si:P). In some embodiments, the silicon-containing material 215 can be an n-type doped silicon layer that is doped with both phosphorus and carbon (Si:CP). Carbon could impede the out-diffusion of phosphorus from the silicon-containing material 215. In some embodiments, the carbon dopant has a concentration in a range from about 0.1% to about 5% (atomic percent). Other types of dopants may also be included.

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof.

The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In other embodiments forming a p-type transistor, the silicon-containing material 215 can be made of at least one material, such as silicon, silicon germanium, other semiconductor materials, and/or any combinations thereof.

As mentioned above, the deposition of the silicon-containing material 215 includes in-situ doping the silicon-containing material 215, in accordance with some embodiments. For example, forming an n-type transistor can use an n-type doping precursor, e.g., phosphorous-containing gases such as phosphine ($PH_3$), arsenic-containing gases such as arsine ($AsH_3$), other n-type dopant-containing gases, or a combination thereof. A carbon-containing gas, such as monomethylsilane (MMS), is also included to dope the silicon-containing material 215 with carbon, in accordance with some embodiments.

The silicon-containing material 215 in recesses 127 is epitaxial. The deposition process forms a thin epitaxial layer of silicon-containing material in recesses 127 and an amorphous silicon-containing material on non-crystalline surfaces. An etching (or partial etching) process removes the amorphous silicon-containing material and also a portion of the silicon-containing material in recesses 127. The remaining silicon-containing material 215 is formed in each of the recesses 127.

In some embodiments, the etching process can use an etching gas including at least one of hydrogen chloride (HCl), chlorine ($Cl_2$), other suitable etching gases, and/or any combinations thereof. The etching process would remove the amorphous silicon-containing material over non-crystalline surface at a rate higher than the removal rate of epitaxial silicon-containing material 215. Therefore, only epitaxial film remains on the substrate surface after a CDDE cycle. The epitaxial deposition/partial etch process is repeated a number of times until a desired thickness is reached. As a result, such repeated deposition/partial etch process is called a cyclic deposition-deposition-etch (CDDE) process.

Figure 4A:
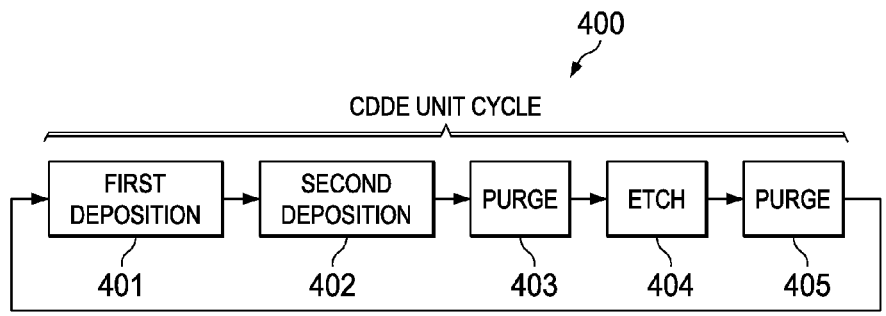
FIG. 4A shows process sequence of a unit cycle of a cyclical deposition-deposition-etch (CDDE) process, in accordance with some embodiments.

FIG. 4A shows the process sequence of a CDDE process 400, in accordance with some embodiments. The process 400 includes a first deposition operation 401, a second deposition operation 402, a post-deposition purge operation 403, a partial-etch operation 404, and a post-etch purge operation 405, in accordance with some embodiments. The CDDE process occurs in a process chamber. The deposition operation 401 employs a silicon-containing gas, such as trisilane ($Si_3H_8$), di-silane ($Si_2H_6$), etc., as silicon source, and a dopant gas, such as $PH_3$, is also used to provide a dopant for the deposited silicon-containing material layer. In some embodiments, the silicon-containing precursor has a flow rate ranging from about 20 standard cubic centimeters per minute (sccm) to about 500 sccm. In some embodiments, the dopant-containing gas has a flow rate ranging from about 20 standard cubic centimeters per minute (sccm) to about 500 sccm.

An inert gas, such as He, Ar, or $N_2$, may also be used in the process. In some embodiments, the inert gas has a flow rate ranging from about 0.5 standard liter per minute (slm) to about 5 slm. In some embodiments, the pressure of the deposition process ranges from about 5 Torr to about 500 Torr. In some embodiments, the deposition temperature is in a range from about 500° C. to about 590° C. In some embodiments, the deposition time is in a range from about 1 second to about 20 seconds. In some embodiments, the amount of the first doped silicon-containing material $215_1$ deposited in operation 401 is in a range from about 10 Å to about 50 Å during each CDDE unit cycle, in accordance with some embodiments. In some embodiments, the N-type dopants, such as P or As, have a concentration in a range from about 8E20 atoms/cm$^3$ to about 5E21 atoms/cm$^3$. As described above, such high dopant concentration is needed to dope LDD regions 113.

After first deposition operation 401, a second deposition operation 402 is used to form a second doped silicon containing material $215_2$ with a lower dopant concentration of N-type dopants than the first doped silicon containing material $215_1$. The process conditions used for operation 402 are the same as operation 401, except with lower dopant gas flow to achieve lower dopant concentration. In some embodiments, the N-type dopants, such as P or As, have a concentration in a range from about 1E20 atoms/cm$^3$ to about 5E20 atoms/cm$^3$. In some embodiments, the deposition time is in a range from about 1 second to about 10 seconds. In some embodiments, the amount of the second doped silicon-containing material $215_2$ deposited in operation 402 is in a range from about 7 Å to about 30 Å during each CDDE unit cycle, in accordance with some embodiments. In some embodiments, the deposition time for operation 402 is in a range from about 1 second to about 20 seconds.

Figure 4B:
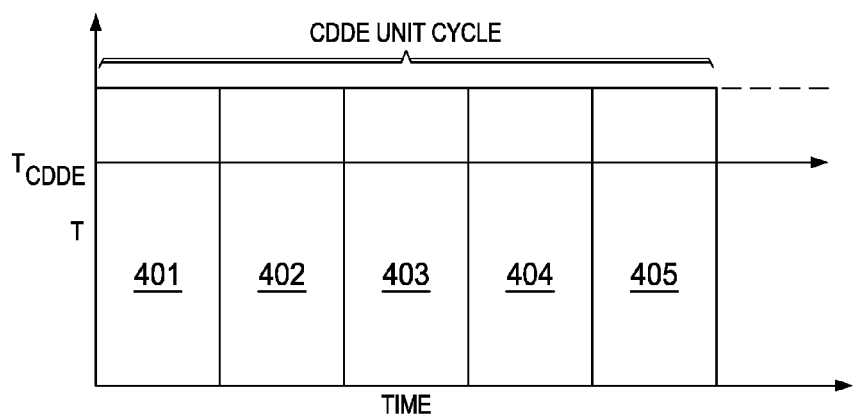
FIG. 4B shows constant process temperature of a CDDE process, in accordance with some embodiments.
Figure 4C:
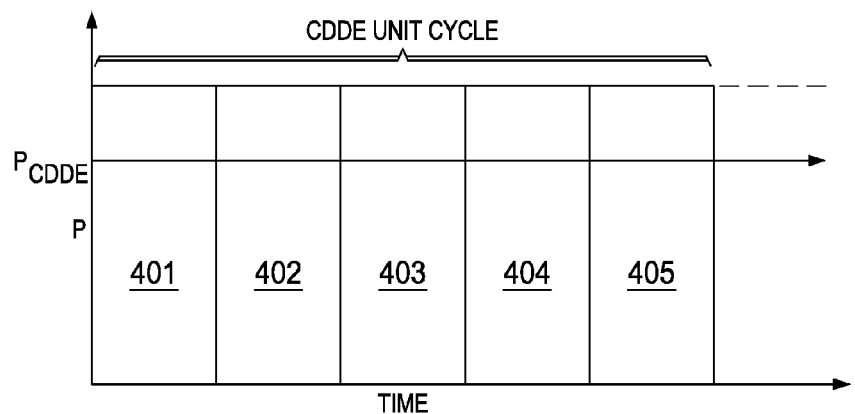
FIG. 4C shows constant process pressure of a CDDE process, in accordance with some embodiments.

After second deposition operation 402, a post-deposition purge operation 403 is used to remove the deposition gas from the process chamber. An inert gas, such as He, Ar, or Ne, could be used in this operation to purge out the deposition gas(es) from the process chamber. In some embodiments, the purge time is in a range from about 1 second to about 20 seconds. Once the chamber is removed of the deposition gases, the etch operation 404 follows. In some embodiments, the etch operation 404 employs $Cl_2$ gas as etchant. In some embodiments, the $Cl_2$ gas has a flow rate ranging from about 100 standard cubic centimeters per minute (sccm) to about 1000 sccm. A non-reactive carrier gas, such as an inert gas, or $N_2$, is also used in the etch gas mixture in accordance with some embodiments. $Cl_2$ react with silicon to etch silicon. $Cl_2$ is more reactive than HCl and can effectively remove silicon at a temperature in the same range as the deposition temperature for operations 401 and 402. As a result, the CDDE process can be conducted under isothermal condition without changing process temperature for different process operations during the CDDE process. In some embodiments, the process pressure is maintained the same (or isobaric) throughout the CDDE process. FIG. 4B shows the CDDE process is operated under a constant process temperature $T_{CDDE}$ throughout the CDDE cycle, in accordance with some embodiments. FIG. 4C shows the CDDE process is operated under a constant process pressure $P_{CDDE}$ throughout the CDDE cycle, in accordance with some embodiments.

In some embodiments, the process temperature $T_{CDDE}$ is less than about 650° C. In other embodiments, the deposition temperature ranges from about 500° C. to about 650° C. The pressure of the deposition process is in a range from about 5 Torr to about 500 Torr, in accordance with some embodiments. Operating the CDDE process under isothermal and isobaric conditions has the advantage of better process control and better chamber matching compared to performing the depositions and etching under different temperatures or pressure. In some embodiments, the etch time of operation 404 is in a range from about 1 second to about 20 seconds.

Figure 5A:
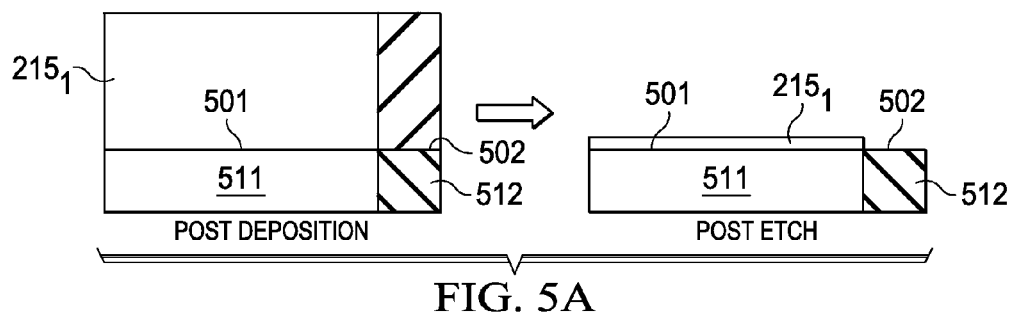
FIG. 5A shows cross-sectional views of a substrate with a crystalline portion and an amorphous portion after depositing a material and after etching a portion of the material, in accordance with some embodiments.

$Cl_2$ is very reactive (more reactive than HCl). By using $Cl_2$ as an etchant, the etch time can be reduced. However, the etch rate of silicon-containing materials, such as $215_1$ and $215_2$, by $Cl_2$ is affected by dopant concentration of N-type dopants in the materials. For the current disclosure, the targeted dopant concentration of the doped source and drain regions is set high, such as in a range from about 7E20 atoms/cm$^3$ to about 3E21 atoms/cm$^3$, to enable diffusing the N-type dopants into the LDD regions 113. The high dopant concentration in the first doped silicon-containing material $215_1$ increases its etch rate by $Cl_2$. Without forming a second doped silicon-containing material $215_2$, with lower dopant concentration, over the first doped silicon-containing material $215_1$, the reactive $Cl_2$ would remove the first doped silicon-containing material $215_1$ quickly and leaves very little behind. FIG. 5A shows a first doped silicon-containing material $215_1$ formed over crystalline Si surface 501, which is over a crystalline portion 511, in crystalline form and over dielectric surface 502, which is over an amorphous portion 512, in amorphous form after a deposition operation, in accordance with some embodiments. FIG. 5A also shows the first doped silicon-containing material $215_1$ over crystalline surface 501 is almost completely removed after an etch operation using $Cl_2$ as an etchant. The amorphous first doped silicon-containing material $215_1$ over dielectric surface 502 is completely removed. Such high etching rate of the first doped silicon-containing material $215_1$ over crystalline Si surface 501 makes such cyclic deposition/ etch (CDE) process not manufacturable due to low net deposition rate.

Figure 5B:
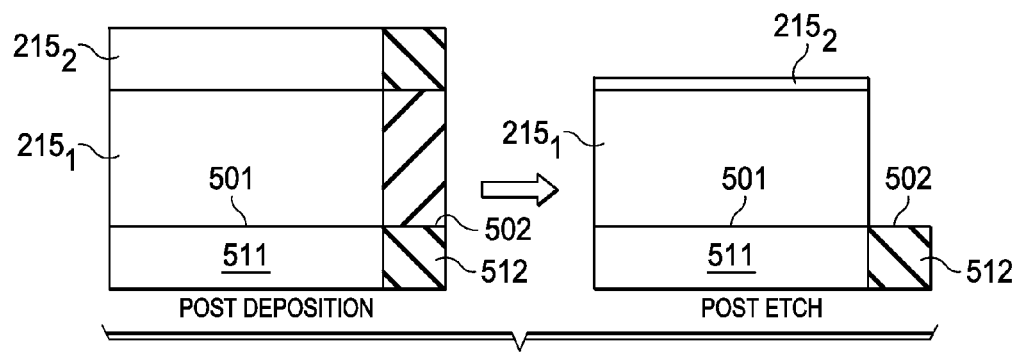
FIG. 5B shows cross-sectional views of a substrate with a crystalline portion and an amorphous portion after depositing a first and a second material, and after etching a portion of the material, in accordance with some embodiments.

As a result, a second doped silicon-containing material $215_2$ is formed over the first doped silicon-containing material $215_1$ to it from the $Cl_2$ etchant. The second doped silicon-containing material $215_2$ has a lower dopant concentration, such as in a range from about 1E20 atoms/cm$^3$ to about 5E20 atoms/cm$^3$, the etch rate of material $215_2$ by $Cl_2$ is lower and more controllable. FIG. 5B shows the as deposited materials $215_1$ and $215_2$, in accordance with some embodiments. Materials $215_1$ and $215_2$ are in crystalline form over surface 501 and in amorphous form over surface 502. FIG. 5B also shows that after the etch operation in the CDDE process, a small amount, such as in a range from about 0.2 nm to about 2.5 nm in some embodiments, of second doped silicon-containing material $215_2$ remains over first doped silicon-containing material $215_1$ on surface 501. The amorphous layers ($215_1$ and $215_2$) are completely removed. As mentioned above, the silicon-containing materials in amorphous form have higher etch rates than in crystalline form.

After the etching operation 404, the purge operation 405 follows to remove the etching gases used in operation 404 from the chamber. The process condition of purge operation 405 is similar to purge operation 403 in some embodiments. In some embodiments, the purge time is in a range from about 1 second to about 20 seconds.

In each CDDE unit cycle, a net thickness in a range from about 1 nm and about 6 nm is formed in a unit cycle in accordance with some embodiments. After operation 405, the process sequence involving operations 401-405 repeats again until the targeted thickness of doped silicon-containing material 215, which includes materials $215_1$ and $215_2$, is reached.

Figure 6:
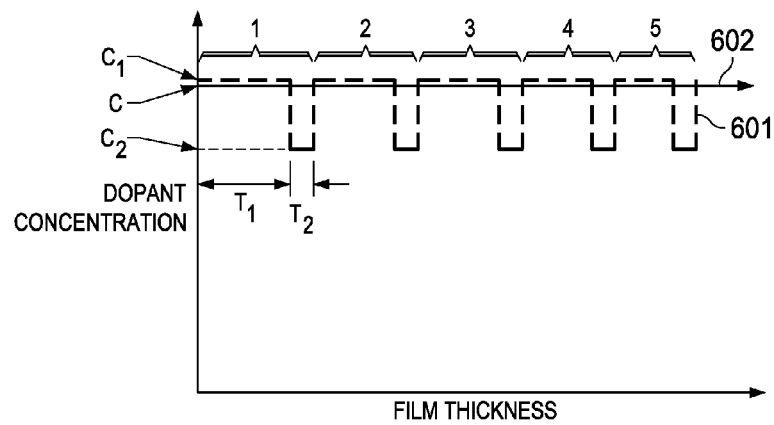
FIG. 6 shows dopant profiles of a silicon-containing material as deposited and after a thermal anneal, in accordance with some embodiments.

FIG. 6 shows dopant concentration of N-type dopants in the as-deposited silicon-containing material 215 (noted by dotted line 601) by the CDDE process described above as a function of film thickness, in accordance with some embodiments. FIG. 6 shows that the silicon-containing material 215 includes sub-layers $215_1$ and $215_2$ in a number of cycles of CDDE process. As described above, the first doped silicon-containing material $215_1$ has higher dopant concentration $C_1$ than the second doped silicon-containing material $215_2$, whose concentration is $C_2$. FIG. 6 shows that the film thickness $T_1$ of material $215_1$ is larger than the thickness $T_2$ of material $215_2$. In some embodiments, the ratio of $T_1$ to $T_2$ ($T_1/T_2$) is equal to or greater than about 5.

FIG. 2 shows that an anneal is performed at operation 207 to drive dopants in the doped source and drain regions into LDD regions and to active dopants, in accordance with some embodiments. The thermal anneal may utilize rapid thermal processing (RTP) anneal, spike anneal, millisecond anneal, laser anneal, or a combination thereof.

In some embodiments, the anneal process utilizes a 2-stage pre-heat millisecond anneal. Substrate 102 first undergoes a warm-up and is heated to a temperature in a range from about 400° C. to about 600° C. with a duration in a range from about 2 seconds to about 20 seconds, in some embodiments. The wafer then undergoes a second pre-heat at a temperature in a range from about 700° C. at about 900° C. for a duration in a range from about 1 second to about 20 seconds. During the half point of the second stage preheat, the temperature of the wafer is quickly raised to the peak anneal temperature by millisecond anneal. For example, if the preheat duration during the second stage preheat is 4 seconds, the wafer temperature is raised to peak anneal temperature after 2 seconds of the second stage preheat. Flash anneal lamps, such as xenon (Xe) arc lamps or argon (Ar) arc lamps, may be used to achieve such a rapid temperature rise. The second stage preheat continues for another 2 seconds. The peak temperature for the millisecond anneal is in a range from about 950° C. to about 1200° C. for a duration in a range from about 1 milliseconds (ms) to about 40 ms, in accordance with some embodiments.

Figure 7:
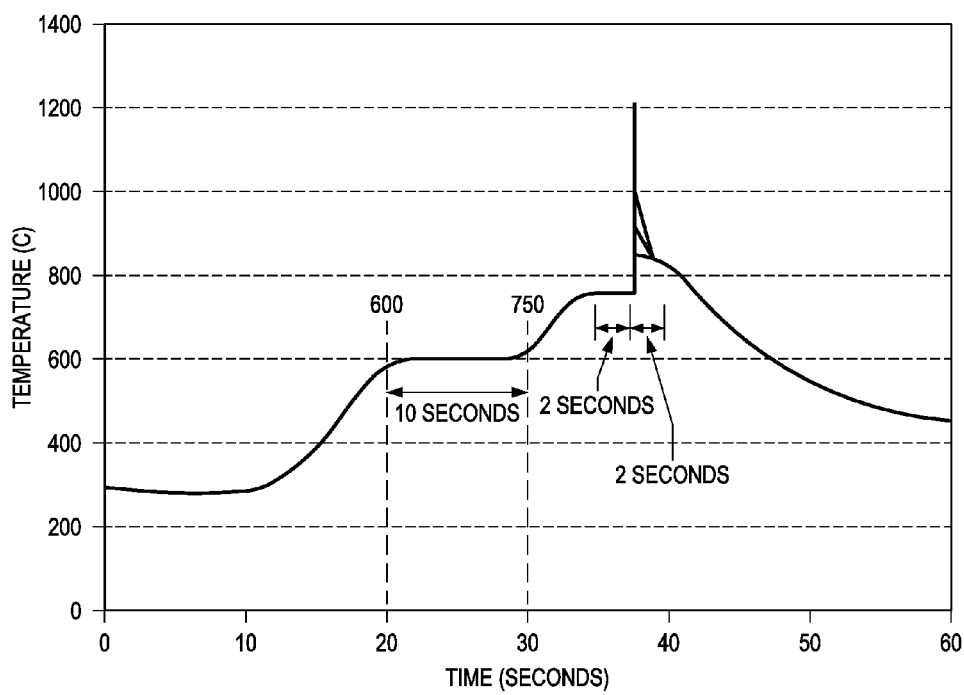
FIG. 7 shows a temperature diagram of a 2-stage preheat millisecond anneal, in accordance with some embodiments.

FIG. 7 shows a temperature diagram of a 2-stage preheat millisecond anneal, in accordance with some embodiments. The millisecond anneal (or flash anneal) portion of FIG. 7 includes profiles of multiple millisecond anneal times (or soak times) from 2 ms to 9 ms with the peak temperature targeted at 1100-1200° C. The substrate is pre-heated to 600° C. and is held for 10 seconds at 600° C. Afterwards, the substrate is raised to 750° C. and is maintained at 750° C. for 4 seconds. As mentioned above, the second stage preheat continues for another 2 seconds. In the middle of the second stage preheat, the millisecond anneal is performed. Other anneal processes may also be used. Details of alternative anneal processes are described in U.S. patent application Ser. No. 13/183,909, titled "Methods of Anneal After Deposition of Gate Layers," and filed on Jul. 15, 2011, which is incorporated herein in its entirety. However the process conditions may be modified to fit the needs to the current disclosure.

The thermal anneal described above not only drive the N-type dopants in doped silicon-containing material 215, but also redistribute N-type dopants in material 215. As mentioned above in the description of FIG. 6, the as-deposited silicon-containing material 215 include sub-layers $215_1$ and $215_2$ in a number of cycles of CDDE process. After the thermal anneal, the dopants in the first doped silicon-containing material $215_1$ would diffuse to the second doped silicon-containing material $215_2$ to reach an equalized and even dopant concentration throughout material 215. The solid line 602 in FIG. 6 shows the post anneal dopant concentration, in accordance of some embodiments. With $T_1$ much greater than $T_2$ and $C_1$ significantly higher than $C_2$, the post anneal dopant concentration C is close to $C_1$, in some embodiments. In some embodiments, C is in a range from about 7E20 atoms/cm$^3$ to about 3E21 atoms/cm$^3$.

Figure 8A:
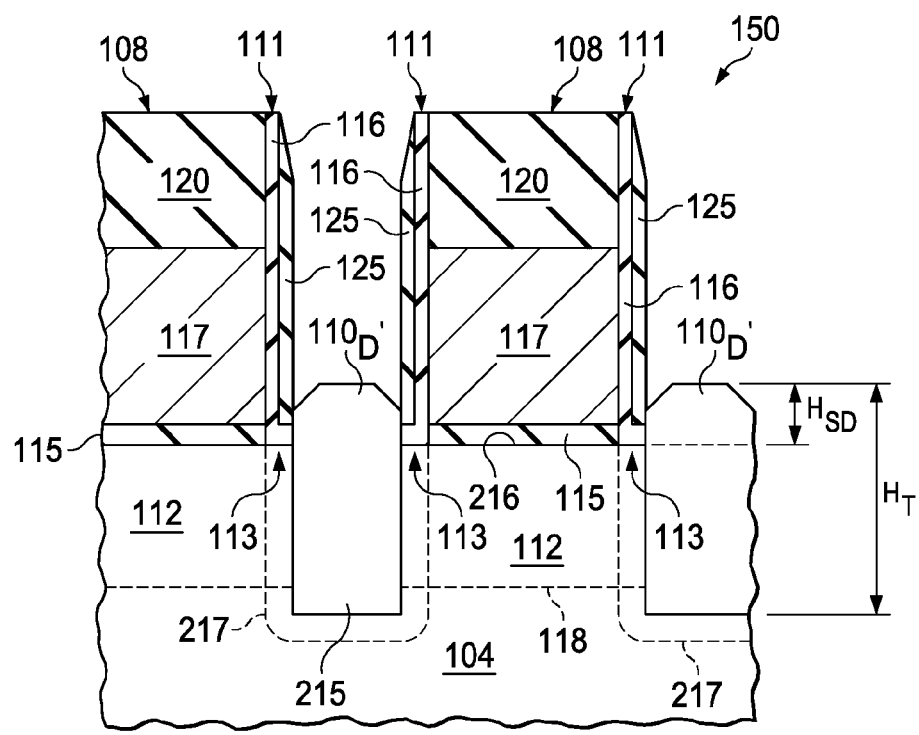
FIGS. 8A and 8B show cross-sectional views of a transistor region after forming the doped source and drain regions, in accordance with some embodiments.
Figure 8B:
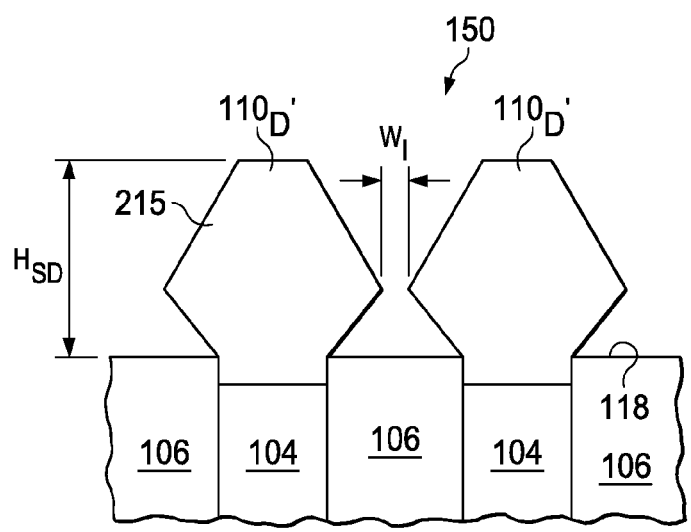

FIGS. 8A and 8B show cross-sectional views of doped drain regions 110$_D$' formed by CDDE process described above, in accordance with some embodiments. The growth rate of epitaxial Si depends on the crystal orientation. Growth rate is slower on closed-packed {111} planes. The doped drain regions 110$_D$' are made of doped silicon-containing material 215, which also form doped source regions 110$_S$' (not shown in FIGS. 8A and 8B). In some embodiments, the total thickness $H_T$ of epitaxial silicon-containing material 215 is in a range from about 40 nm to about 50 nm. The height (or thickness) $H_4$ of doped drain regions 110$_D$' above surface 216 between channel regions 112 and gate dielectric layer 115 is in a range from about 10 nm to about 20 nm, in some embodiments. The height (or thickness) $H_{SD}$ of doped drain regions 110$_D$' above surface 118 is in a range from about 35 nm to about 45 nm, in some embodiments. The shortest distance $W_I$ between two neighboring doped drain regions 110$_D$' is in a range from about 10 nm to about 20 nm, in accordance with some embodiments. Doped source regions 110$_S$' resemble the doped drain regions 110$_D$'. The description above for doped drain regions 110$_D$' also applies for doped source regions 110S'.

As mentioned above, the epitaxial silicon-containing material 215 is an n-type doped silicon layer doped with phosphorus, in accordance with some embodiments. In some embodiments, the epitaxial silicon-containing material 215 is also doped with carbon. Carbon could impede the out-diffusion of phosphorus from the silicon-containing material 215. The phosphorus- and carbon-doped silicon layer can be referred to as a Si:CP layer. The dopants in the silicon-containing material 215 deposited by CDE have higher level of activation than implanted dopants. As mentioned above, the dopant activation level is in a range from about 7E20 atoms/cm$^3$ to about 3E21 atoms/cm$^3$, in some embodiments. The n-type dopants, such as P or As, are driven into LDD regions 113, which is underneath spacers 111 and next to doped source and drain regions 110D', 110S' by thermal anneal to increase the dopant concentration in LDD regions 113. Dotted lines 217 in FIG. 8A note the boundaries of areas have the targeted LDD dopant level after the anneal, in accordance with some embodiments. LDD regions 113 are within the boundary. In some embodiments, the targeted dopant level in LDD regions 113 is in a range from about 1E20 atoms/cm$^3$ to about 5E20 atoms/cm$^3$. The thermal anneal not only can drive the dopants into the source and drain regions 110D' and 110S' regions, but also can activate the dopants. The thermal anneal furthers redistributes the periodic variation of dopant concentrations in the as-deposited material 215, as described above.

Figure 9:
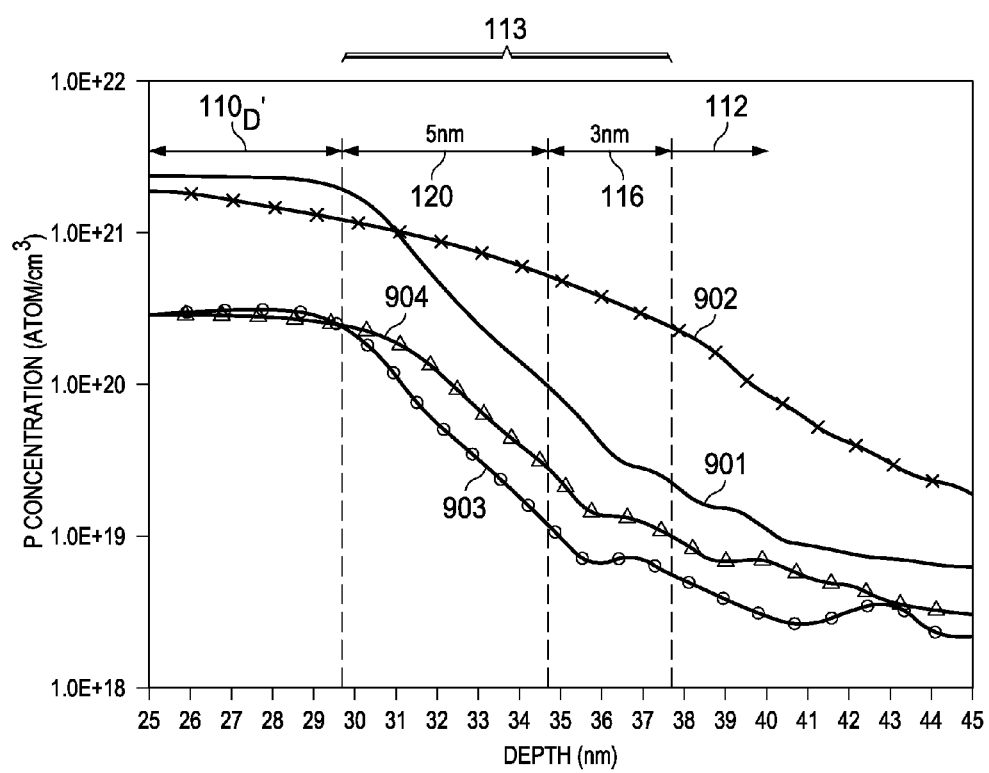
FIG. 9 shows four dopant profiles, in accordance with some embodiments.

FIG. 9 shows 2 as-deposited dopant (phosphorus, P) profiles 901 and 903, and correlated post-anneal dopant (phosphorus, P) profiles 902 and 904, in accordance with some embodiments. Profile 901 (solid line without additional marks) covers 4 regions, drain region 110$_D$' (or source region 110$_S$'), under main spacer layer 120, under offset spacer layer 116 and in channel region 112. As mentioned above, the region under spacer layers 120 and 116 is LDD region 113. Profile 501 shows that the as-deposited epitaxial silicon-containing material 215 in drain region 110$_D$' has a concentration at about 3E21 atom/cm$^3$. The dopant concentration drops rapidly to 3E19 atoms/cm$^3$ at the edge of channel region 112. Dopants under spacer layers 120 and 116, and in channel region 112 diffuse to these regions during the CDDE deposition process. In the embodiment shown in FIG. 9, the thickness of the main spacer layer 120 is about 5 nm and the thickness of the offset spacer layer 116 is about 3 nm. When substrate with dopant profile 901 is annealed using the millisecond anneal process described above. The process use a pre-heat temperature at about 750° C. and undergoes millisecond anneal at about 1120° C. for about 2 ms. Profile 502, which include cross (x) marks, shows that millisecond anneal drives the dopants into LDD region 113 and increase the dopant concentration in this region to above about 4E20 atoms/cm$_3$. Some dopants are driven into channel region 112, as shown in FIG. 9. FinFET devices are more resistant to short channel effect. Device results, such as "on current" ION, show an about 10% performance improvement by using the process described above of forming doped source and drain regions and anneal without LDD ion implant. ION shows an about 10% improvement due to reduction in $R_{external}$ (external resistance) as a result of higher dopant density in the source and drain regions.

Profile 903 (with circle marks) is an as-deposited dopant profile and profile 904 (with triangle marks) is a post-anneal profile of profile 903. The anneal process for profile 904 is the same as the process used for profile 902. Profile 903 has a lower as-deposited concentration at drain region 110$_D$' (7E20 atoms/cm$^3$). Due to the lower as-deposited dopant concentration, the anneal is not able to increase the dopant concentration in the LDD region 113 to above 1E20 atoms/cm3. The results in FIG. 9 show that the as-deposited material 215 should have a relatively high dopant (N-type) concentration.

Figure 10:
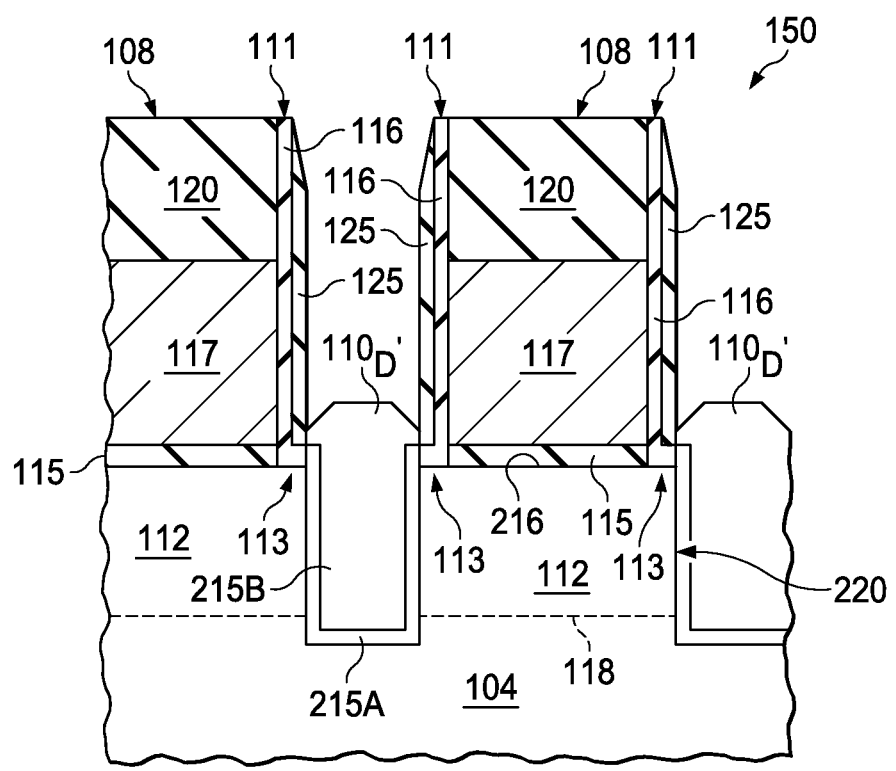
FIG. 10 shows a cross-sectional view of the structure of FIG. 3A with two silicon-containing materials in doped drain regions, in accordance with some embodiments.

As described above, the process described above for epitaxially growing the silicon-containing material 215 to form doped source/drain regions 110$_D$',110$_S$' use CDDE process to form doped material 215. In addition, the dopant concentration is maintained high to enable dopant diffusion. However, only a thin layer of the doped source next to the LDD regions 113 is needed to provide dopants to the LDD regions. The remaining source/drain regions could be doped at a lower concentration level. FIG. 10 shows a cross-sectional view of the structure of FIG. 8A with two silicon-containing materials 215$_A$ and 215$_B$ to form the doped drain regions 110$_D$' and before post-deposition anneal, in accordance with some embodiments. The first silicon-containing material 215$_A$ is formed first and is similar to the silicon-containing material 215 described above both in process method, film properties, and dopant level(s). It has high dopant concentration to enable doping the LDD regions 113 to reach targeted dopant level. The second silicon-containing material 215$_B$ is formed over the first silicon-containing material 215$_A$.

The second silicon-containing material 215$_B$ may be formed by CDDE process that is similar to the process used to form material 215$_A$, but with a lower dopant level. Both materials 215$_A$ and 215$_B$ are epitaxial. During the deposition of materials 215$_A$ and 215$_B$, sub-layers similar to 215$_1$ and 215$_2$ described above are formed in each of materials 215A and 215B.

However, in some embodiments, the second silicon-containing material 215$_B$ is formed by a non-CDDE epitaxial process. CDDE process is relatively slow; therefore, it could be desirable to use an alternative epitaxial process to form material 215$_B$. For example, a selective epitaxial growth (SEG) process may be used to deposit the second silicon-containing material 215$_B$. The SEG process has a higher growth rate than the CDDE process, in accordance with some embodiments. The SEG process is a selective deposition process and the silicon-containing material 215$_B$ formed by this process deposits on epitaxial silicon-containing material 215$_A$. SEG processes utilize simultaneous deposition and etch.

In some embodiments, the silicon-containing material 215$_B$ is doped with phosphorus (Si:P). In some embodiments, the N-type dopant concentration of material 215$_B$ is in a range from about 1E20 atoms/cm$^3$ to about 5E20 atoms/cm$^3$. The thickness of material 215$_A$ has a minimal thickness about 1 nm, in some embodiments. The thickness of material 215$_A$ is in a range from about 1 nm to about 10 nm, in accordance with some embodiments.

Although the doping mechanisms described above are for N-type devices. Similar doping mechanisms may be applied to P-type devices with necessary modification of process flow and dopant type.

Embodiments of mechanisms for epitaxially growing one or more doped silicon-containing materials to form source and drain regions of finFET devices are provided in this disclosure. The dopants in the one or more doped silicon-containing materials can be driven into the neighboring lightly-doped-drain (LDD) regions by thermal anneal to dope the regions. The epitaxially growing process uses a cyclical deposition/deposition/etch (CDDE) process. In each cycle of the CDDE process, a first and a second doped materials are formed and a following etch removes most of the second doped material. The first doped material has a higher dopant concentration than the second material and is protected from the etching process by the second doped material. The CDDE process enables forming a highly doped silicon-containing material.

In some embodiments, a method of growing a doped epitaxial material is provided. The method includes providing a semiconductor substrate, and the semiconductor substrate has an epitaxial surface and an amorphous surface. The method also includes performing a cyclic deposition-deposition-etch (CDDE) process to grow the doped epitaxial material over the epitaxial surface and not on the amorphous surface. Each cycle of the CDDE process forms a first doped epitaxial material and a second doped epitaxial material. A portion of the second doped epitaxial material is removed an etch process in each cycle of the CDDE process.

In some other embodiments, a method of growing a doped epitaxial material is provided. The method includes providing a semiconductor substrate, and the semiconductor substrate has an epitaxial surface and an amorphous surface. The method also includes performing a first cyclic depositiondeposition-etch (CDDE) process to grow a first portion of the doped epitaxial material over the epitaxial surface and not on the amorphous surface. Each cycle of the first CDDE process forms a first doped epitaxial material and a second doped epitaxial material. A portion of the second doped epitaxial material is removed an etch process in each cycle of the CDDE process, and the first portion of the doped epitaxial material has a first average dopant concentration of N-type dopants. The method further includes performing a second CDDE process to grow a second portion of the doped epitaxial material over the first portion of the doped epitaxial material. A process sequence of the second CDDE process is similar to the first CDDE process; and the second portion of the doped epitaxial material has a second average dopant concentration of N-type dopants.

In yet some other embodiments, a method of forming a semiconductor device on a semiconductor substrate is provided. The method includes providing the substrate with a first plurality of fins and a second plurality of gate structures, and forming spacers on each of the second plurality of gate structures. The method also includes etching portions of the first plurality of fins not covered by the plurality of gate structures to form recesses in the first plurality of fins below exposed surfaces of isolation structures between the first plurality of fins. The recesses are below surfaces of isolation structures neighboring the fins. The method further includes forming doped source and drain regions for the second plurality of gate structures by epitaxially growing the at least one silicon-containing material from the recesses. A CDDE process is used for the epitaxially growing. Each cycle of the CDDE process forms a first doped epitaxial material and a second doped epitaxial material. A portion of the second doped epitaxial material is removed an etch process in each cycle of the CDDE process.

It is understood that different embodiments disclosed herein offer different disclosure, and that they may make various changes, substitutions and alterations herein without departing from the spirit and scope of the present disclosure. For example, the embodiments disclosed herein describe formation of a tensile stress in a fin region. However, other embodiments may include forming a compressive stress in fin region by providing the relevant stress layer (e.g., stress-transferring layer) overlying the fin region. Examples of compressive stress generating films may include metal nitride compositions.

What is claimed is:

1. A method comprising:
   providing a semiconductor substrate with fins and gate structures;
   forming spacers on each of the gate structures;
   etching portions of the fins not covered by the gate structures to form recesses in the fins below exposed surfaces of isolation structures between the fins, wherein the recesses are below surfaces of isolation structures neighboring the fins; and
   forming doped source and drain regions for the gate structures by epitaxially growing at least one silicon-containing material from the recesses, wherein a cyclic deposition-deposition-etch (CDDE) process is used for the epitaxially growing, and wherein each cycle of the CDDE process forms a first doped epitaxial material during a first deposition step and a second doped epitaxial material during a second deposition step subsequent to the first deposition step, a first dopant concentration of the first doped epitaxial material being different from a second dopant concentration of the second doped epitaxial material, wherein a portion of the second doped epitaxial material is removed an etch process in each cycle of the CDDE process.

2. The method of claim 1, further comprising performing a thermal anneal after forming the doped source and drain regions.

3. The method of claim 2, wherein the thermal anneal drives dopants from the first doped epitaxial material into a corresponding one of the fins.

4. The method of claim 2, wherein the thermal anneal equalizes dopant concentrations of the first doped epitaxial material and the second doped epitaxial material.

5. The method of claim 1, wherein the first dopant concentration is greater than the second dopant concentration.

6. The method of claim 1, wherein the CDDE process is isothermal.

7. The method of claim 1, wherein the CDDE process is isobaric.

8. The method of claim 1, wherein the first deposition step forms a first amorphous material on the surfaces of the isolation structures, the second deposition step forms a second amorphous material on the first amorphous material, and the etch process removes the first amorphous material and the second amorphous material from the surfaces of the isolation structures.

9. The method of claim 1, wherein the first deposition step includes a first dopant precursor gas with a first flow rate, and the second deposition step includes a second dopant precursor gas with a second flow rate, the first flow rate being different from the second flow rate.

10. A method comprising:
    providing a semiconductor substrate with a fin and a gate structure on the fin;
    forming a spacer on the gate structure;
    etching a portion of the fin exposed from the gate structure to form a recess in the fin, wherein the recess is below surfaces of isolation structures on opposing sides of the fin and in the semiconductor substrate; and
    forming doped source/drain region for the gate structure by epitaxial growth, wherein the epitaxial growth comprises a cyclic deposition-deposition-etch (CDDE) process, each cycle of the CDDE process comprising a first deposition step, a second deposition step after the first deposition step, and an etching step after the second deposition step, wherein the first deposition step forms a first doped epitaxial material by using a first dopant precursor gas with a first flow rate, the second deposition step forms a second doped epitaxial material by using a second dopant precursor gas with a second flow rate, the first flow rate being different from the second flow rate, and the etching step removing a portion of the second doped epitaxial material.

11. The method of claim 10, wherein the first flow rate is greater than the second flow rate.

12. The method of claim 10, wherein a first dopant concentration of the first doped epitaxial material is different from a second dopant concentration of the second doped epitaxial material.

13. The method of claim 10 further comprising a thermal anneal performed after the epitaxially growing.

14. The method of claim 10, wherein the CDDE process is isothermal and isobaric.

15. The method of claim 10, wherein the first deposition step forms a first amorphous material on the surfaces of the isolation structures, the second deposition step forms a second amorphous material on the first amorphous material, and the etching step removes the first amorphous material and the second amorphous material from the surfaces of the isolation structures.

16. The method of claim 10, wherein the epitaxial growth forms a silicon-containing material.

17. A method comprising:
   providing a semiconductor substrate with a fin and a gate structure on the fin;
   etching a portion of the fin proximate to the gate structure to form a recess in the fin, wherein the recess is below surfaces of isolation structures on opposing sides of the fin and in the semiconductor substrate; and
   forming doped source/drain region for the gate structure by epitaxially growing a silicon-containing material, wherein the epitaxially growing comprises a cyclic deposition-deposition-etch (CDDE) process, each cycle of the CDDE process comprising:
      performing a first deposition step, the first deposition step forming a first doped epitaxial material and a first amorphous material, the first deposition step comprising using a first dopant precursor gas with a first flow rate, the first doped epitaxial material having a first dopant concentration,
      performing a second deposition step after the first deposition step, the second deposition step forming a second doped epitaxial material and a second amorphous material, the second deposition step comprising using a second dopant precursor gas with a second flow rate, the second doped epitaxial material having a second dopant concentration, the first flow rate being different from the second flow rate, the first dopant concentration being different from the second dopant concentration, and
      performing an etching step after the second deposition step, the etching step removing the first amorphous material and the second amorphous material.

18. The method of claim 17 further comprising performing an anneal after forming the doped source/drain region.

19. The method of claim 17, wherein the first flow rate is greater than the second flow rate, and the first dopant concentration is greater than the second dopant concentration.

20. The method of claim 17, wherein the CDDE process is isothermal and isobaric.

* * * * *